United States Patent
Diazzi et al.

[11] Patent Number: 5,804,884
[45] Date of Patent: Sep. 8, 1998

[54] SURFACE ELECTRICAL FIELD DELIMITING STRUCTURE FOR AN INTEGRATED CIRCUIT

[75] Inventors: Claudio Diazzi, Milan; Bruno Murari, Monza; Ubaldo Mastromatteo, Cornaredo; Claudio Contiero, Buccinasco, all of Italy

[73] Assignee: SGS-Thomson Microelectronics S.r.l., Agrate Brianza, Italy

[21] Appl. No.: 492,597

[22] Filed: Jun. 20, 1995

[30] Foreign Application Priority Data

Jun. 20, 1994 [EP] European Pat. Off. ............. 94830300

[51] Int. Cl.⁶ ........................... H01L 23/58; H01L 23/28; H01L 23/29
[52] U.S. Cl. .......................... 257/787; 257/173; 257/632; 257/647; 257/648; 257/788
[58] Field of Search .................................... 257/173, 632, 257/647, 648, 787, 788, 635

[56] References Cited

U.S. PATENT DOCUMENTS

| 4,400,711 | 8/1983 | Avery | 257/133 |
| 4,825,278 | 4/1989 | Hillenius et al. | 257/630 |
| 5,341,005 | 8/1994 | Canclini | 257/173 |
| 5,610,435 | 3/1997 | Watanabe et al. | 257/629 |

FOREIGN PATENT DOCUMENTS

| 0160941 | 11/1985 | European Pat. Off. | H01L 23/52 |
| 0 567 694 A1 | 11/1993 | European Pat. Off. | H01L 23/522 |
| 1251456 | 10/1971 | United Kingdom | H01L 5/06 |

*Primary Examiner*—Mahshid D. Saadat
*Assistant Examiner*—Allan R. Wilson
*Attorney, Agent, or Firm*—Seed and Berry LLP

[57] ABSTRACT

The resin sealing layer enclosing the device is biased to a low voltage by means of an anchoring structure formed close to high-voltage contact pads. The anchoring structure is formed by a metal region deposited on the surface of the device and contacting the resin layer, and by a deep region extending from the surface of the device, beneath the metal region, to the substrate. The electrical field in the resin layer is confined between the high-voltage pads and the anchoring structure and prevented from generating polarity inversions in the semiconductor material at the low-voltage contact pads or any other points at which the resin layer contacts the body of semiconductor material.

13 Claims, 1 Drawing Sheet

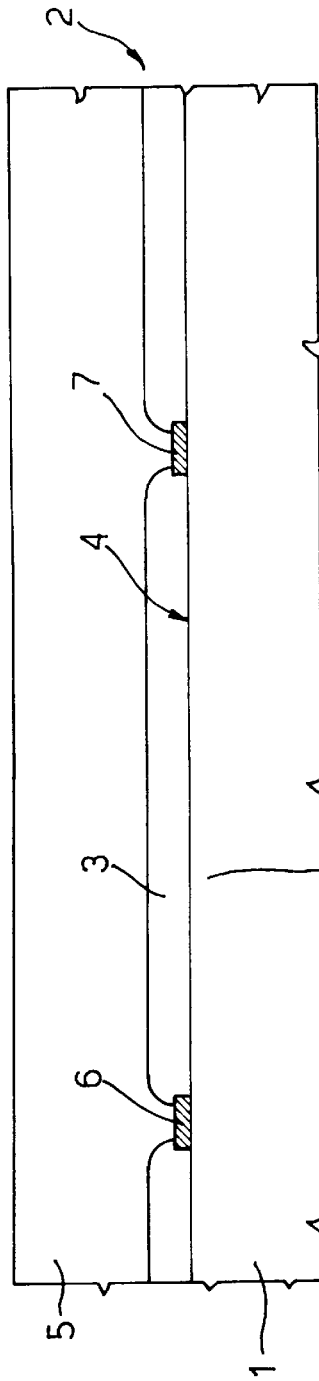
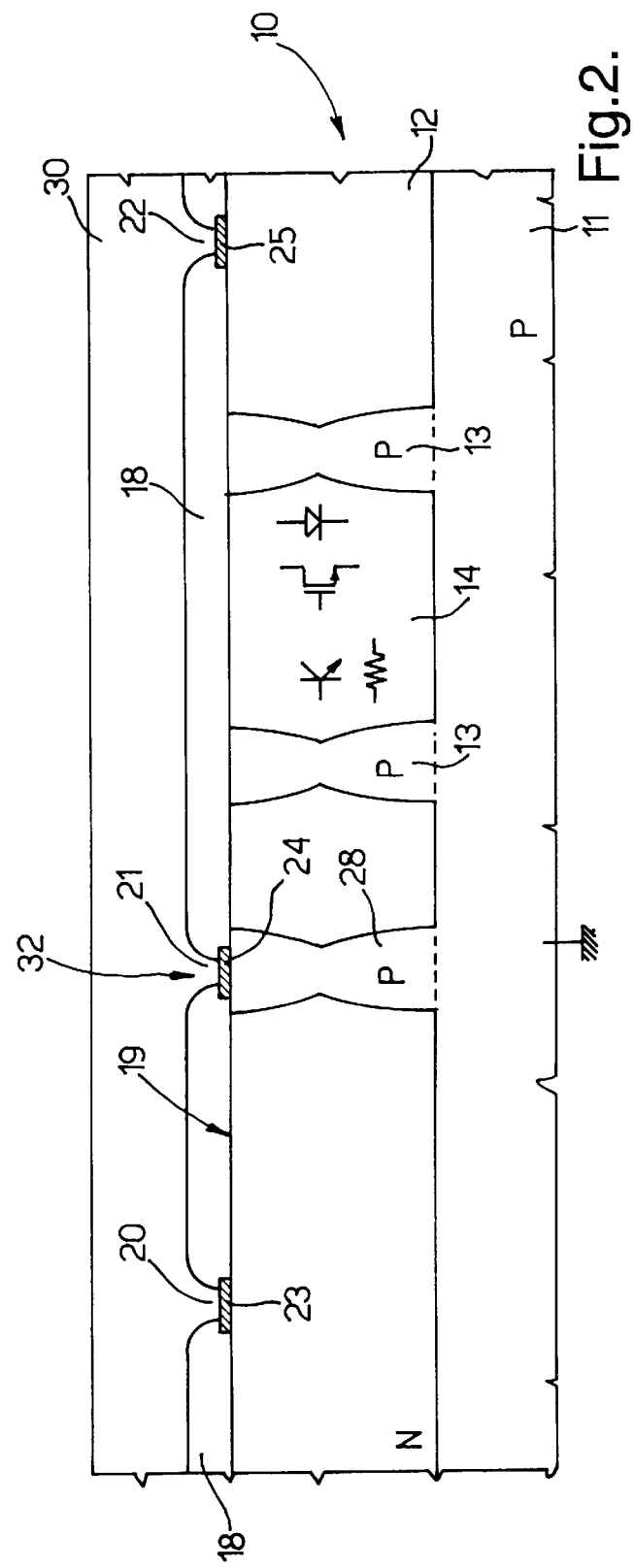

SURFACE ELECTRICAL FIELD DELIMITING STRUCTURE FOR AN INTEGRATED CIRCUIT

TECHNICAL FIELD

The present invention relates to an integrated device with a surface electrical field delimiting structure, and relative fabrication process.

BACKGROUND OF THE INVENTION

As is known, integrated devices frequently present surface electrical fields caused by charges in the surface layers of the device or by surface layers biased to given potentials. Such surface fields may bias the surface layers and/or the overall protective surface layer of the device.

Surface electrical fields are undesired on account that they may invert the polarity of certain surface portions of the device, thus forming, and possibly also turning on, parasitic MOS transistors that may impair the operation of the device.

This possibility is typically encountered in the case of high-voltage devices (e.g., up to 600 V) with high-voltage contact pads left exposed by the passivation layer interposed between the surface of the device and the protective layer, which is typically the resin that forms the package of the integrated device or a junction coating formed between the passivation layer and the package. In this case, the high-voltage pads directly contact the protective layer and bias this layer to their own high potential, and may invert the surface layer of the adjacent body of semiconductor material.

To demonstrate this more clearly, an example structure is illustrated in FIG. 1, which shows the surface portion 1 of a high-voltage integrated device 2; a passivation layer 3 covering surface 4 of device 2; and an overall protective layer 5. At various points, passivation layer 3 is interrupted by contact pads, of which FIG. 1 shows only a high-voltage pad 6 and a low-voltage pad 7. In the example shown, the electrical field generated by high-voltage pad 6 biases protective layer 5 and produces a difference in potential in the portion of layer 5 between pads 6 and 7; and, if the voltage of pad 6 is high, biasing of protective layer 5 may invert the polarity of the underlying portion 8 of the device.

Existing techniques for eliminating or at least delimiting surface electrical fields comprise the formation of field plates or channel stoppers. Such structures, however, take up a considerable area if formed over the entire surface of the device.

SUMMARY OF THE INVENTION

It is an object of one aspect of the present invention to provide an integrated device with a structure capable of delimiting the electrical fields in the protective layer without recourse to structures such as field plates or channel stoppers.

In accordance with one aspect of the present invention, an integrated device includes a semiconductor body having a bias region. A passivation layer is disposed on the body. An anchor couples the passivation layer to the bias region.

In accordance with another aspect of the invention, a protective layer is disposed on the passivation layer, and the anchor couples the protective layer to the bias region.

In practice, according to one aspect of the present invention, the protective layer enclosing the device is biased to a low voltage, so that the electrical field in the regions of protective layer near the active regions implemented in the semiconductor material presents a zero value.

BRIEF DESCRIPTION OF THE DRAWINGS

A non-limiting embodiment of the present invention is described by way of example with reference to the accompanying drawings, in which:

FIG. 1 shows a cross section of a known integrated device.

FIG. 2 shows a cross section of a portion of semiconductor material implementing the integrated device with a delimiting structure according to the present invention.

DETAILED DESCRIPTION OF THE INVENTION

Of integrated device 10 in FIG. 2, only the parts pertinent to the present invention are shown. More specifically, device 10 comprises a substrate 11, in this case a P-type; and an epitaxial layer 12, in this case an N-type. Epitaxial layer 12 presents deep regions 13, in this case P-types, constituting junction isolating regions and laterally defining active regions 14 (only one shown) in which the device components are formed, e.g., bipolar or MOS transistors, diodes, etc., as represented by the electric symbols.

A passivation layer 18 covers the whole of upper surface 19 of epitaxial layer 12, with the exception of openings 20, 21, and 22 at respective metal portions 23, 24, and 25. More specifically, metal portion 23 forms a high-voltage (e.g., 600 V) contact pad and connects (over metal lines not shown) high-voltage portions of device 10 to contact wires (not shown) for connection to pins (not shown) on the device; metal portion 25 forms a low-voltage contact pad and connects (over metal lines not shown) low-voltage portions of device 10 to respective contact wires; and metal portion 24—located close to high-voltage pad 23 and between pad 23 and active regions 14 (in which the components of device 10 are formed)—is connected to substrate 11 via a deep region 28, in this case a P-type region formed using the so-called "top-bottom" technique, i.e., by predepositing doping agents on substrate 11 before growing epitaxial layer 12 to form the bottom portion, and by downward diffusing doping agents into the grown, epitaxial layer 12 to form the top portion.

The device is sealed over its entire surface, which may either form the, device package or a junction coat that protects passivation layer 18 from the package by a protective layer 30.

In practice, in the FIG. 2 stricture, passivation layer 18 is opened adjacent to high-voltage pad 23, and provision is made at opening- 21 for a metal line or region 24 anchored to ground (substrate 11) via deep region 28. As such, the potential gradient in protective layer 30 is confined to the region between high-voltage pad 23 and opening 21, so that the electrical field in protective layer 30 between openings 21 and 22 is zero and prevented from inverting polarity in the active regions (such as 14) between the ground anchoring openings and low-voltage pads and so impairing operation of the integrated components in the active regions.

In other words, metal portion 24 and deep region 28 form an element 32 for electrically anchoring resin layer 30 to ground.

Voltage-anchoring structure 32 is preferably so formed as to essentially surround the pad 23 the high-voltage surface regions between pads 23 and 24 contacting protective layer 30, and so separate them electrically from the low-voltage regions.

It should be pointed out that the term "low voltage" is here intended to mean any potential (with respect to the minimum potential of the device, normally that of the substrate) below the value at which the semiconductor material may undergo polarity inversion. (This known value varies according to the manufacturing process and the characteristics of the material. In one aspect of the invention, "low voltage" corresponds substantially to voltages below 20 V). Conversely, the term "high voltage" is intended to mean a potential of such a value as to cause polarity inversion of the semiconductor material.

Moreover, anchoring structure 32 is advantageously not directly connected to any active region 14 of the device; the term "direct connection" here being intended to mean any path along which humidity can travel, and therefore excluding any electrical paths through the epitaxial layer and the substrate.

Anchoring structure 32 in no way impairs the electrical characteristics of the device. In the event that humidity may infiltrate through the opening in passivation layer 18 and so corrode the underlying metal region 24, the metal region 24 is not connected to the active areas, as above indicated. Therefore, any corrosion of the metal region 24 does not impair operation of the device, but merely reduces the field delimiting effect of the anchoring structure. Conversely, in the event the device is adequately safeguarded against humidity penetrating through opening 21, e.g., by the superior characteristics of the outer protective layer, direct electrical connections (via metal lines extending over surface 19) may be made to components of the device.

The structure according to one aspect of the present invention is fabricated as follows. Firstly, deep region/s 28 for anchorage to substrate 11 is/are grown using, for example, the top-bottom technique described above, and preferably simultaneously with the formation of other deep regions such as isolating regions 13. The components are then formed in epitaxial layer 12 according to the structure and characteristics of device 10, and one or more metal lines 24 (or even appropriately shaped regions) are deposited and shaped close to high-voltage pads 23. This step may also be performed simultaneously with formation of the metal contact regions and contact pads 23 and 25 of the device (or of the lower metal level if the device comprises a number of metal levels). At this point, passivation layer 18 is deposited and etched to form openings 21 at metal lines or regions 24, which step may also be performed simultaneously with the formation of openings 20 and 22 at contact pads 23 and 25. This is then followed by the usual finish steps, including cutting the chip; bonding it to the lead frame; soldering the contact wires; and molding the resin sealing casing 30. At this stage, the material forming protective layer 30 penetrates inside the passivation openings, including opening or openings 21, so as to contact line 24 and thus anchor to ground the potential of the resin portion adjacent to metal region 24. As such, fabrication of the electrical field delimiting structure according to the present invention involves no additional cost, but merely alteration of the various fabrication masks.

Clearly, changes may be made to the device and fabrication process as described and illustrated herein without, however, departing from the spirit and scope of the present invention. In particular, the integrated device may be any type formed using any technique; and deep region 28 may be formed in any appropriate manner for electrically connecting metal anchoring region 24 to the substrate or any other region of the device that is held at a low voltage under any conditions; the term "low voltage" being intended to mean, as already stated, potentials not resulting in polarity inversion of the semiconductor material. Furthermore, in embodiments where no protective layer 30 is used (such as with a hermetically-sealed package), anchoring structure 32 is suitable to delimit electric fields in the passivation layer 18.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An integrated device with a surface electrical field delimiting structure, comprising a body of semiconductor material having a surface covered with a passivation layer underlying a layer of plastic material; characterized in that it comprises means for providing an electrical path from said layer of plastic material to a lowest-potential bias region of said body of semiconductor material.

2. The device according to claim 1, further comprising high-voltage formations contacting said layer of plastic material; wherein said path providing means are located close to said high-voltage formations.

3. The device as according to claim 1 wherein said body of semiconductor material comprises active regions integrating electronic components; wherein said electrical path providing means are not connected directly to said electronic components in said active regions.

4. The device according to claim 1 wherein said path providing means comprise at least one through opening formed in said passivation layer and filled with said plastic material, for connecting said layer of plastic material to said bias region.

5. The device according to claim 4 wherein it comprises at least one formation of conductive material on said surface of said body of semiconductor material at said at least one opening.

6. The device according to claim 5 wherein said formation of conductive material comprises a metal line.

7. The device according to claim 5 wherein said body of semiconductor material comprises a substrate region and an epitaxial region superimposed on said substrate region and forming said surface; wherein said bias region is formed by said substrate region; and comprises at least one deep contact region extending in said epitaxial region between said formation of conductive material and said substrate region.

8. The device according to claim 7 wherein said deep contact region is of the same conductivity type as said substrate region.

9. A semiconductor device, comprising:
   a substrate that has a low-potential bias region formed therein;
   an epitaxial layer formed on said substrate;
   an active region formed in said epitaxial layer;
   an isolation region formed in said epitaxial layer to isolate said active region from a remaining region of said epitaxial layer;
   a first contact formed on said epitaxial layer adjacent to a first side of said active region;
   a second contact formed on said epitaxial layer adjacent to a second side of said active region;
   a path formed in said remaining region between said second contact and said second side and contacting said bias region;
   a passivation layer formed on said epitaxial layer and having first, second, and third openings corresponding to said contacts and said path respectively; and a plastic layer formed on said passivation layer and in said openings and contacting said path.

10. An integrated device comprising:

a substrate of semiconductor material having electrically active areas therein;

a plurality of layers above said substrate including electrically conductive layers;

a passivation layer overlying the plurality of layers;

a plastic layer overlying said passivation layer; and an electrically conductive path extending from the protective layer to a lowest-voltage bias region in the substrate of semiconductor material.

11. The device according to claim 10 wherein said plastic layer encapsulating said integrated device.

12. The device according to claim 10 wherein said electrically conductive path includes a metallic contact that is coupled to said protective layer and is coupled to a conductive region of said semiconductor material.

13. The device according to claim 10 wherein said electrically conductive path includes a heavily doped semiconductor region that is doped with the same conductivity type as the substrate for providing an electrically conductive path of the same conductivity type from the substrate to the protective layer.

\* \* \* \* \*